United States Patent
Kikkawa (10) Patent No.: US 7,224,004 B2
(45) Date of Patent: May 29, 2007

(54) COMPOUND SEMICONDUCTOR DEVICE AND METHOD OF FABRICATING THE SAME

(75) Inventor: Toshihide Kikkawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/813,085

(22) Filed: Mar. 31, 2004

(65) Prior Publication Data

US 2005/0087766 A1    Apr. 28, 2005

(30) Foreign Application Priority Data

Oct. 28, 2003    (JP)  .............................. 2003-367932

(51) Int. Cl.
*H01L 29/739* (2006.01)
*H01L 29/06* (2006.01)

(52) U.S. Cl. ..................... 257/194; 257/20; 257/24

(58) Field of Classification Search .................. 257/20, 257/24, 194; 438/59, 590
See application file for complete search history.

(56) References Cited

U.S. PATENT DOCUMENTS 6,897,495 B2 *    5/2005  Yoshida et al. .............. 257/192

OTHER PUBLICATIONS

Patent Abstracts of Japan, Publication No. 2001-185717, dated Jul. 6, 2001.
Patent Abstracts of Japan, Publication No. 2002-359256, dated Dec. 13, 2002.
T. Hashizume, et al.; "Discrete surface state related to nitrogen-vacancy defect on plasma-treated GaN surfaces"; *Applied Physics Letters*; vol. 80; No. 24; Jun. 17, 2002; pp. 4564-4566.

* cited by examiner

*Primary Examiner*—Hung Vu
(74) *Attorney, Agent, or Firm*—Armstrong Kratz Quintos Hanson & Brooks, LLP (57) ABSTRACT

In formation-by-growth of an AlGaN layer 3 as having a double-layered structure, a non-doped AlGaN layer (i-AlGaN layer) having an Al compositional ratio of approximately 15% is formed to a thickness of approximately 3 nm on an i-GaN layer, and further thereon, an AlGaN layer (n-AlGaN layer) doped with Si in a concentration of approximately $2 \times 10^{18}/cm^3$ and having an Al compositional ratio of approximately 15% is formed to a thickness of approximately 17 nm.

11 Claims, 12 Drawing Sheets

REVERSE GATE LEAKAGE ($\mu$A/mm)
(@Vg=$-$5V)=1.8E$-$6*10^ (2.15*x*d*(nm))

CURRENT COLLAPSE : $1e-6*Nd*d\ (nm)/4 - 2.7e12 * (0.05*x*d\ *(nm))$

COMPOUND SEMICONDUCTOR DEVICE AND METHOD OF FABRICATING THE SAME

CROSS-REFERENCE TO RELATED APPLICATIONS

This application is based upon and claims the benefit of priority from the prior Japanese Patent Application No. 2003-367932, filed on Oct. 28, 2003, the entire contents of which are incorporated herein by reference.

BACKGROUND OF THE INVENTION

1. Field of the Invention

The present invention relates to a compound semiconductor device having so-called HEMT structure, and a method of fabricating the same.

2. Description of the Related Art

In recent years, extensive efforts have been directed to development of electronic devices using sapphire, SiC, GaN or Si as a substrate, and using a GaN layer and an AlGaN layer sequentially stacked thereon by crystal growth so as to allow the GaN layer to function as an electron transit layer. The GaN layer is largely expected for its operation under a large voltage resistance because it has a band gap energy of 3.4 eV, which is larger than 1.4 eV of GaAs.

There is a need of high voltage operation for recent amplifiers at base stations of cellular phone, where high voltage resistance is becoming essential. Zero-current voltage resistance of as large as exceeding 200 V is reported at present.

There is also a need of suppressing so-called current collapse, which is fluctuation in ON-resistance during the operation, for which it is necessary to further dispose an additional GaN layer on the AlGaN layer and to form an SiN protective film.

This configuration also makes it possible to further improve the voltage resistance if a gate electrode is formed in an over-hung geometry on the SiN protective film.

Figure 12:
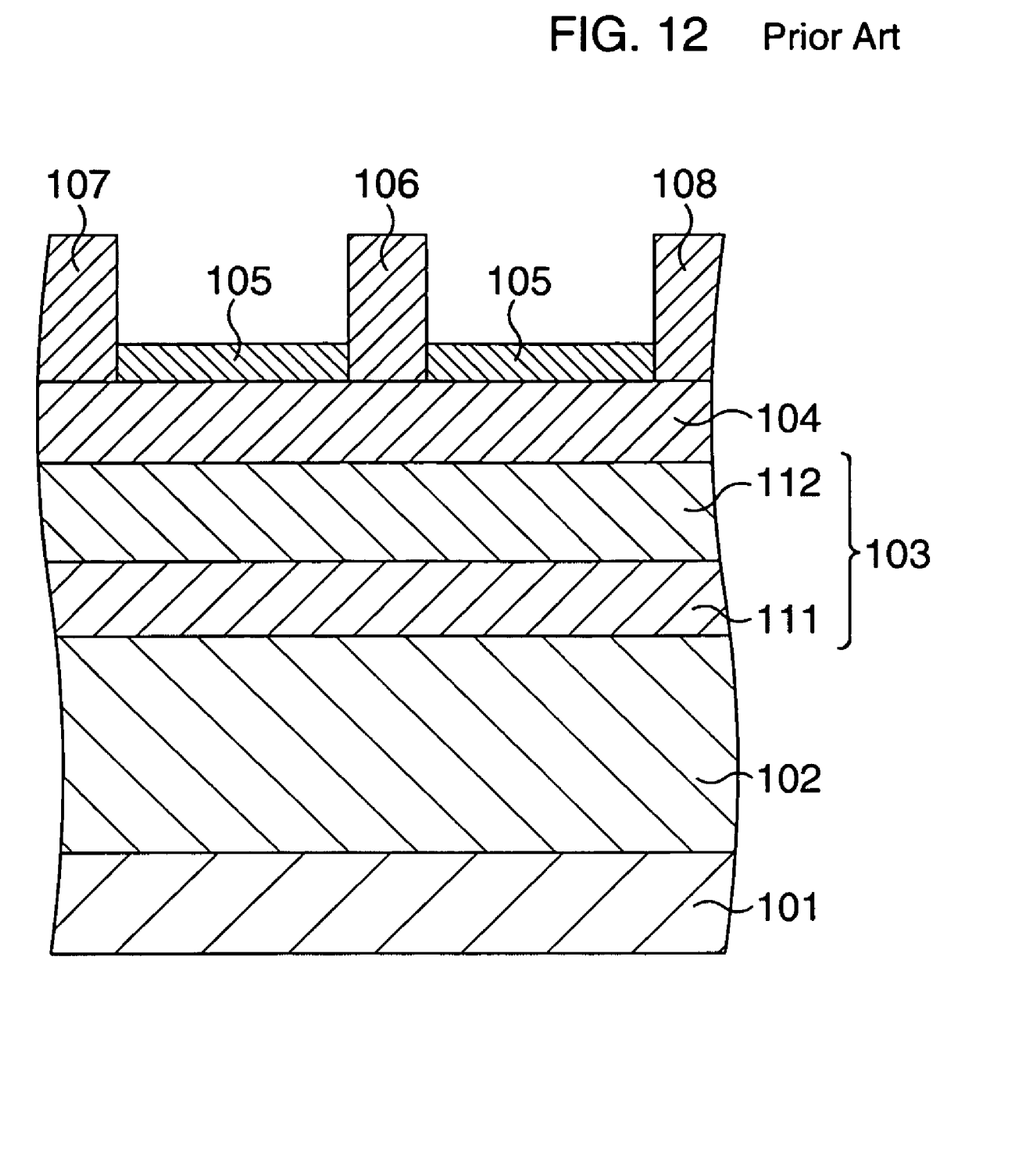
FIG. 12 is a schematic sectional view showing a conventional compound semiconductor device having a HEMT structure.

One known specific example of the compound semiconductor device having the HEMT structure is shown in FIG. 12 (see Patent Document 1).

The compound semiconductor device has, as being sequentially stacked on a substrate 101 by the epitaxial growth process, a non-doped GaN layer (i-GaN layer) 102, an AlGaN layer 103 and a GaN layer (n-GaN layer) 104 doped with an n-type impurity, and further comprises a gate electrode 106 which establishes Schottky contact with the n-GaN layer 104 through an SiN film 105 formed on the n-GaN layer 104, and a source electrode 107 and a drain electrode 108 which establish ohmic contact with the n-GaN layer 104.

The AlGaN layer 103 herein further comprises an i-AlGaN layer 111 having a thickness of approximately 3 nm and an Al composition of approximately 25%, and an n-type AlGaN layer (n-AlGaN layer) 112 having a thickness of approximately 22 nm and an Al composition of approximately 25% stacked with each other.

[Patent Document 1]

Japanese Patent Application Laid-Open No. 2002-359256.

The compound semiconductor device shown in FIG. 12, however, found to have a problem in that it has a leakage current of the gate electrode larger than a specified value required for the device. That is, it is becoming clear that the compound semiconductor device has a large absolute value of the leakage current even if it is rated as 100 V or above in terms of breakdown voltage resistance or gate voltage resistance. This is because a large roughness right under the gate electrode is causative of a local concentration of electric field, and the leakage as a consequence.

The present invention was conceived after considering the above-described problems, and an object thereof is to provide a compound semiconductor device having a reduced current collapse and an improved RF characteristic so as to achieve a sufficient voltage resistance required for the amplifiers at the base stations for cellular phone, and a method of fabricating such compound semiconductor device.

SUMMARY OF THE INVENTION

A compound semiconductor device of the present invention has a stack formed on a substrate, which stack comprises a first nitride semiconductor layer which later becomes an electron transit layer; a second nitride semiconductor layer which later becomes an electron supply layer and contains Al; and a third nitride semiconductor layer having an Al content of zero or smaller than that of the second nitride semiconductor layer, all of the layers being sequentially grown on the substrate, wherein the third nitride semiconductor layer has a nitrogen vacancy ratio of 20% or less within a range as deep as 2 nm or less from the surface thereof.

Another aspect of a compound semiconductor device of the present invention has a stack formed on a substrate, which stack comprises a first nitride semiconductor layer which later becomes an electron transit layer; a second nitride semiconductor layer which later forms an electron supply layer and contains Al; and a third nitride semiconductor layer having an Al content of zero or smaller than that of the second nitride semiconductor layer, all of the layers being sequentially grown on the substrate, wherein the second nitride semiconductor layer is formed in a thickness so as to satisfy the following relation:

$$-80x+29 < d < -180x+52$$

where x denotes the compositional ratio of Al and d (nm) denotes the thickness.

A method of fabricating a compound semiconductor device of the present invention comprises the steps of: forming a first nitride semiconductor layer, which later becomes an electron transit layer, on a substrate; forming on the first nitride semiconductor layer a second nitride semiconductor layer which later becomes an electron supply layer and contains Al; and forming on the second nitride semiconductor layer a third nitride semiconductor layer which is controlled so as to have an Al content of zero or smaller than that of the second nitride semiconductor layer, and a nitrogen vacancy ratio of 20% or less within a range as deep as 2 nm or less from the surface thereof.

DETAILED DESCRIPTION OF THE PREFERRED EMBODIMENTS

Basic Concept of Present Invention

[1] Improvement in Surface Roughness of GaN Layer

Figure 1:
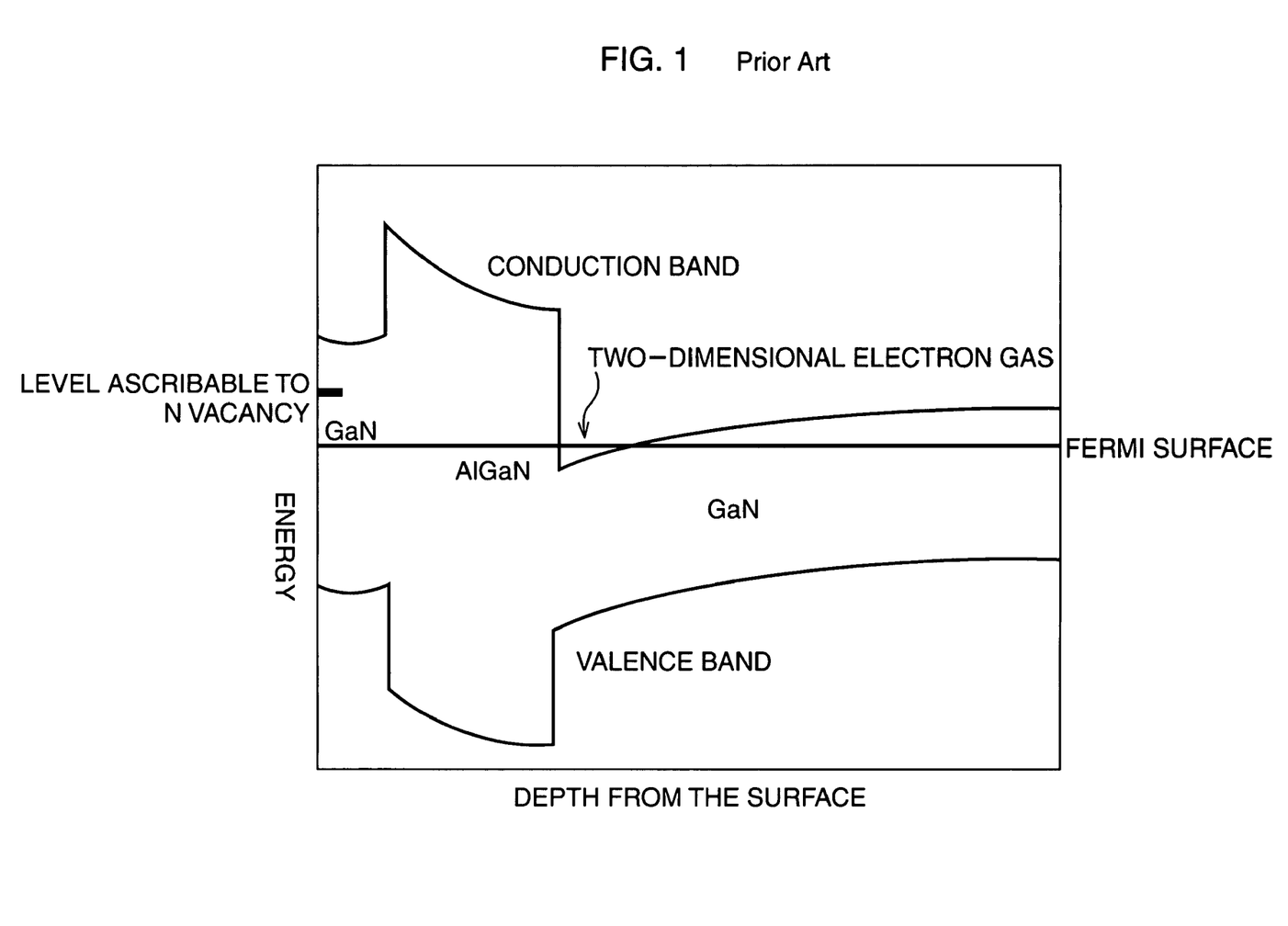
FIG. 1 is a band chart showing a generation state of nitrogen vacancy in a conventional compound semiconductor device having a HEMT structure.

As for a compound semiconductor device having a HEMT structure, the present inventors placed a focus not only on physical roughness right under the gate electrode, but also on roughness in terms of crystal defect. This is a phenomenon ascribable to elimination of nitrogen from the surficial portion of the third nitride semiconductor layer, which is herein a GaN layer. A portion where nitrogen is lost will have a trap at a position approximately 0.4 eV deep from the conduction band as shown in FIG. 1. The trap is mainly causative of the current collapse, and too many traps may form a leakage path. A technique capable of suppressing, in the stage of the epitaxial growth, the nitrogen elimination to a degree tolerable to the process is still unknown.

The phenomenon of the nitrogen elimination per se is reported in non-patent document 1, describing that SiN is successful in suppressing the nitrogen vacancy. This is, however, not sufficient for a compound semiconductor device, and the non-patent document 1 makes no description on AlGaN, and makes no description nor suggestion at all on the nitrogen elimination from GaN having AlGaN thereunder, and correlation among three factors of strain, nitrogen elimination and surface roughness of AlGaN.

The present invention was conceived after focusing the correlation between the surface roughness and nitrogen vacancy.

[Non Patent Document 1]

Applied Physics Letters, Volume 80, Number 24, "Discrete surface state related to nitrogen-vacancy defect on plasma-treated GaN surfaces".

Figure 2:
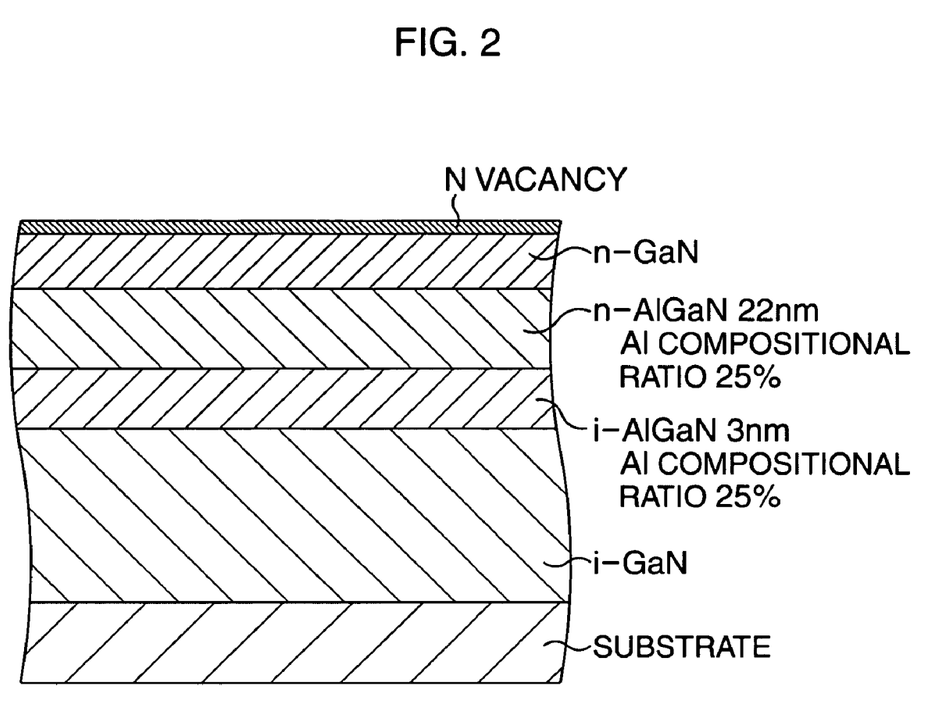
FIG. 2 is a schematic sectional view showing a generation state of nitrogen vacancy.

The present inventors supposed that a portion most contributable to improvement in the crystal defect resides within a depth of approximately 2 nm from the surface of the GaN layer 104 of FIG. 12, as shown in FIG. 2, and found out from an XPS observation that the roughness ascribable to the nitrogen vacancy can be reduced if a nitrogen vacancy ratio is adjusted to as small as 20% or less within a range as deep as 2 nm or less from the surface of the GaN layer. In place of the XPS analysis, the analytical means may be any one of Auger analysis, SIMS analysis, microscopic Raman analysis and microscopic PL analysis. In this case, a two-dimensional electron gas concentration of $1 \times 10^{13}/cm^2$ or above (an Al compositional ratio of 25%, for example) makes it difficult to intrinsically prevent gate leakage due to an excessive amount of two-dimensional electron gas. On the other hand, a two-dimensional electron gas concentration of less than $1 \times 10^{13}/cm^2$ (an Al compositional ratio of 15%, for example) fails in obtaining a desirable RF characteristic due to a large current collapse. The present invention is successful in obtaining a desired high output characteristic without causing the current collapse (ascribable to the surface roughness of the GaN layer) under a two-dimensional electron gas concentration of less than $1 \times 10^{13}/cm^2$.

[2] Exact Definition of Al Compositional Ratio and Thickness of Second Nitride Semiconductor Layer Based on [1]

First, a theoretical background of the definition of Al compositional ratio and thickness will be described.

(1) Definition of Upper Limits of Al Compositional Ratio x and Thickness d: Surface Roughness The surface roughness becomes small when the thickness of the second nitride semiconductor layer (AlGaN layer, herein) is small, and becomes large when the thickness is large. The reason is as follows.

AlGaN and GaN are in a state of lattice mismatching, where strain ascribable to the lattice mismatching results in the aforementioned roughness. An excessive degree of the strain causes lattice relaxation, and bursts into a large amount of dislocation. Under a large surface roughness, distance between the channel and the gate electrode right under the gate tends to vary even immediately before the lattice relaxation, and the electric field concentration consequently tends to vary. This accelerates a local concentration of the electric field and increases the reverse gate leakage.

Degree of the lattice mismatching follows the relation below:

$\delta_a$=(lattice constant (AlGaN)−lattice constant (GaN))/lattice constant (GaN)∝x; and total strain∝$\delta_a$×d.

The total strain $\delta_a$ and surface enthalpy (H) are in an exponential relation, and also the surface enthalpy and surface roughness are in a proportional relation. This is because the surface morphology is governed by the surface enthalpy.

This gives;

reverse gate leakage∝10^(surface roughness)∝surface enthalpy∝total strain∝x×d

In order to prevent the reverse gate leakage, it is therefore important to control the total strain, that is, to properly define Al compositional ratio x and thickness d of the AlGaN layer.

The degree of lattice mismatching is specifically expressed as follows:

lattice constant of AlN=3.112 Å
lattice constant of GaN=3.189 Å

$$\delta_a = (0.077/3.189) \times x$$

$$= 0.024 \times x$$

(The lattice constant linearly varies depending on x. Vegard's Law adopted.)

total strain∝0.024×x×d

Figure 3:
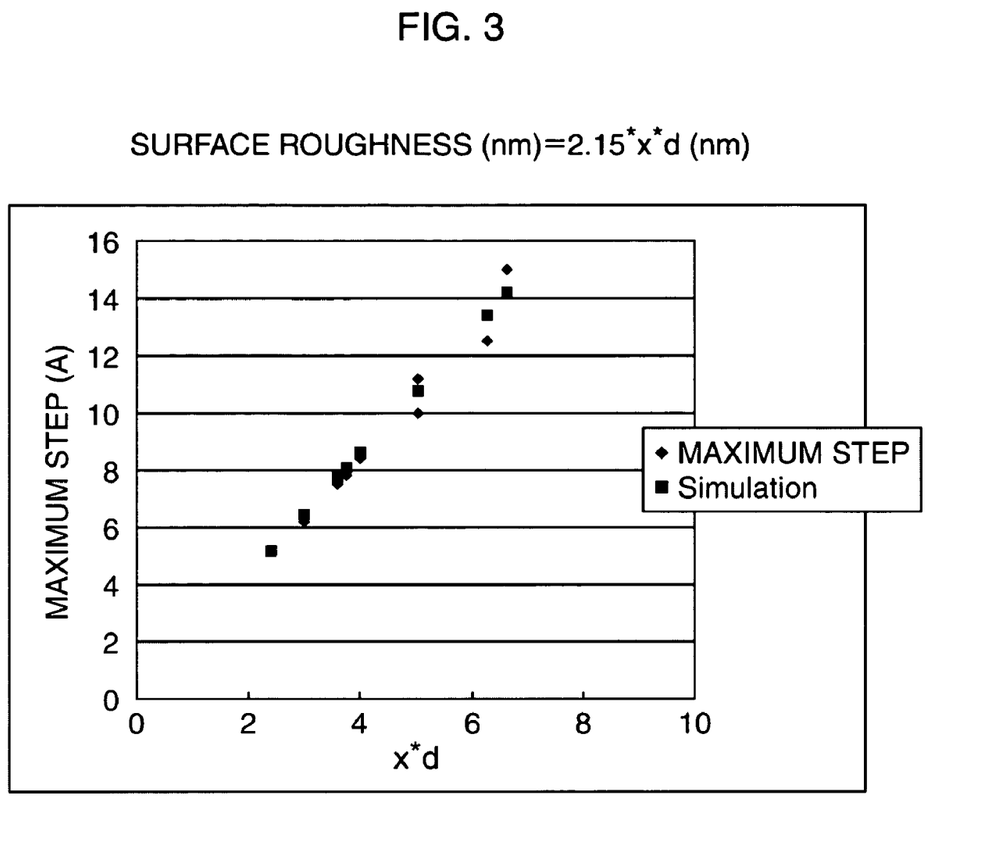
FIG. 3 is a characteristic drawing as an expression of surface roughness, showing relations between x×d and maximum step.
Figure 4:
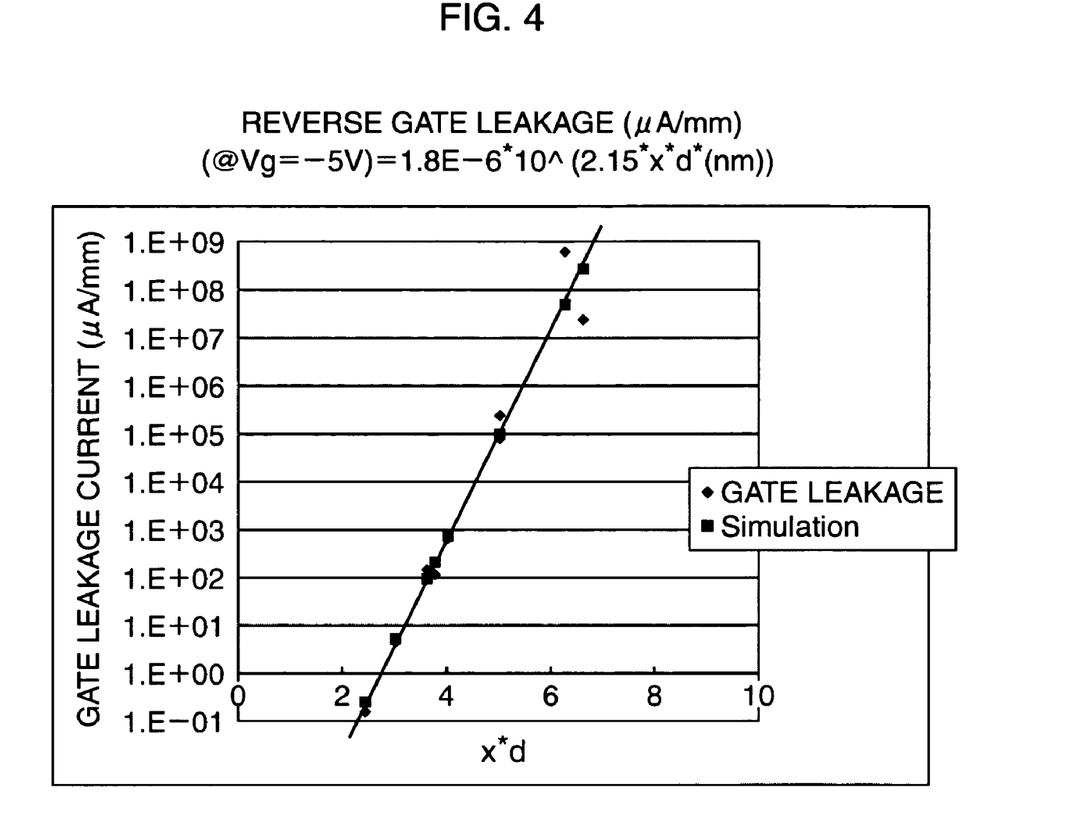
FIG. 4 is a characteristic drawing showing relations of x×d with reverse gate leakage current.

EXAMPLE x=15%, d=20 nm: total strain∝0.72×10⁻⁸ cm
x=25%, d=20 nm: total strain∝1.2×10⁻⁸ cm Although correlation factor involved in the relation of surface enthalpy∝total strain remains to be solved by basic experiments and molecular orbital calculation, experimental data of the reverse gate leakage and surface roughness will help the calculation of the correlation factor:

surface roughness (nm)=2.15×$x$×$d$ reverse gate leakage (μA/mm) ($Vg$=−5$V$)=1.8×$10^{-6}$× $10^{\wedge}(2.15 \times x \times d)$ With respect to the surface roughness, FIG. 3 shows relations between x×d and maximum step, and FIG. 4 shows relations between x×d and reverse gate leakage current. The upper limits of x and d can be defined based on the above-described relations. In particular, the upper limit of the reverse gate leakage current (Vg=−5V) is calculated as 100 (μA/mm).

(2) Definition of Lower Limit of Al Compositional Ratio x: Forward Gate Leakage

Forward gate leakage is specified by Schottky barrier height.

The forward gate leakage at around the maximum output is a critical issue for power devices. At around the maximum output, the gate leakage occurs in the forward direction, rather than in the reverse direction. This is because potential of the gate electrode is biased in the forward direction, and this allows electrons to flow into the gate electrode. To suppress the flow, it is necessary to increase Schottky barrier height between the gate electrode and semiconductor.

Schottky barrier height $\phi B$ is expressed as follows:

$\phi B = Wf - Ef$ (Ef: electron affinity of semiconductor, Wf: work function of gate metal)

$\phi B$ of GaN-base semiconductor can be specified by Ef−Wf since it has only a small effect of interfacial pinning.

Ef herein is governed by the Al compositional ratio x of the AlGaN layer, and is written as:

Ef∝x.

Known values of Ef(AlN)=0.6 and Ef(GaN)=4.1 will give:

$Ef = 4.1 - 3.5x$.

An exemplary case using Ni, which has a Wf of approximately 4.5, will give:

$\phi B$(Ni)=0.4+3.5$x$ (example: $\phi B$=0.93 eV for $x$=0.15).

A value of $\phi B$ of 0.8 eV or larger is essential if the compound semiconductor device of the present invention is intended for use as a power device. This is because the gate electrode should be biased in the forward direction up to +0.8 V or around. This inevitably requires, for the case using Ni, that x is 0.115 or larger.

Also for metals other than Ni, the lower limit of the Al compositional ratio can be specified by the above-described forward gate leakage, because it is unlikely for Wf to largely exceed 4.5 from a practical viewpoint (adhesiveness of the metal taken into account).

(3) Definition of Lower Limit of Thickness: Current Collapse

Current collapse is determined by correlations among the amount of two-dimensional electron gas, total dose within a range from the gate electrode to the channel, and density of the surface trap. Experimentally known correlations include the following:

definition of current collapse δImax=((Imax obtained from DC measurement)−(Imax obtained under pulsed I–V))/(Imax obtained from DC measurement);

amount of two-dimensional gas = Piezo-electronic effect + spontaneous polarization + amount of electron introduced by doping, and amount of current collapse=amount of doped electron−surface trap density.

The current collapse occurs if the value is obtained as negative.

Piezo−electronic effect+spontaneous polarization (/cm$^2$)=3× $10^{13}$×log(12x);

doped electrons (/cm$^2$)=1×$10^{-6}$×Nd×d (nm) (Nd: dose (/cm$^3$));

surface trap density (/cm$^2$)=2.7×$10^{12}$×(0.05×$x$×$d$); and effect of surface trap∝surface defect∝surface roughness∝total strain.

It is not always true that all surface roughness are causative of the trap, showing only a small dependence. The amount of current collapse is then given as:

amount of current collapse=1×$10^{-6}$×(0.05×$x$×$d$).

Figure 5:
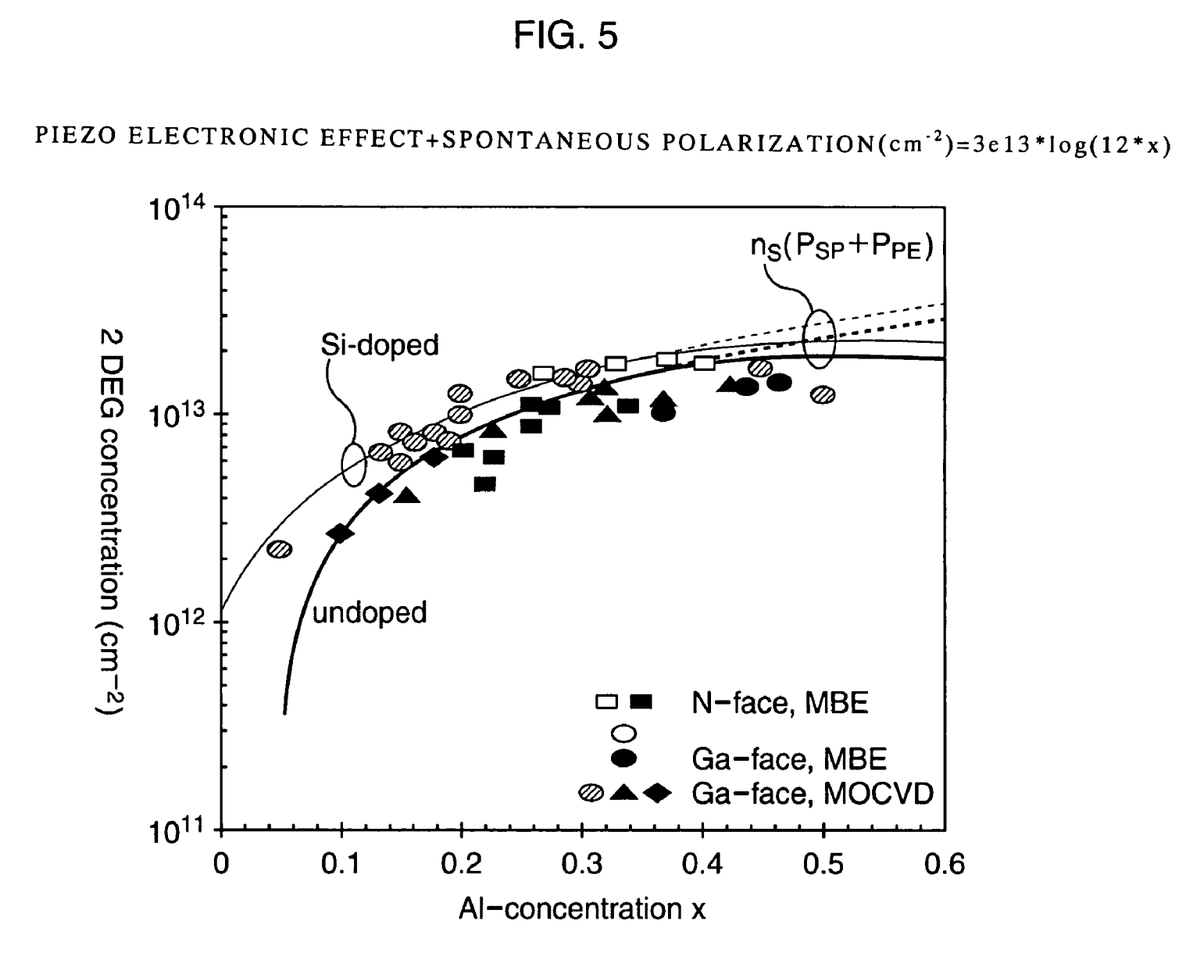
FIG. 5 is a characteristic drawing as an expression of Piezo electronic effect as combined with spontaneous polarization, showing relations between x and two-dimensional electron gas concentration.
Figure 6:
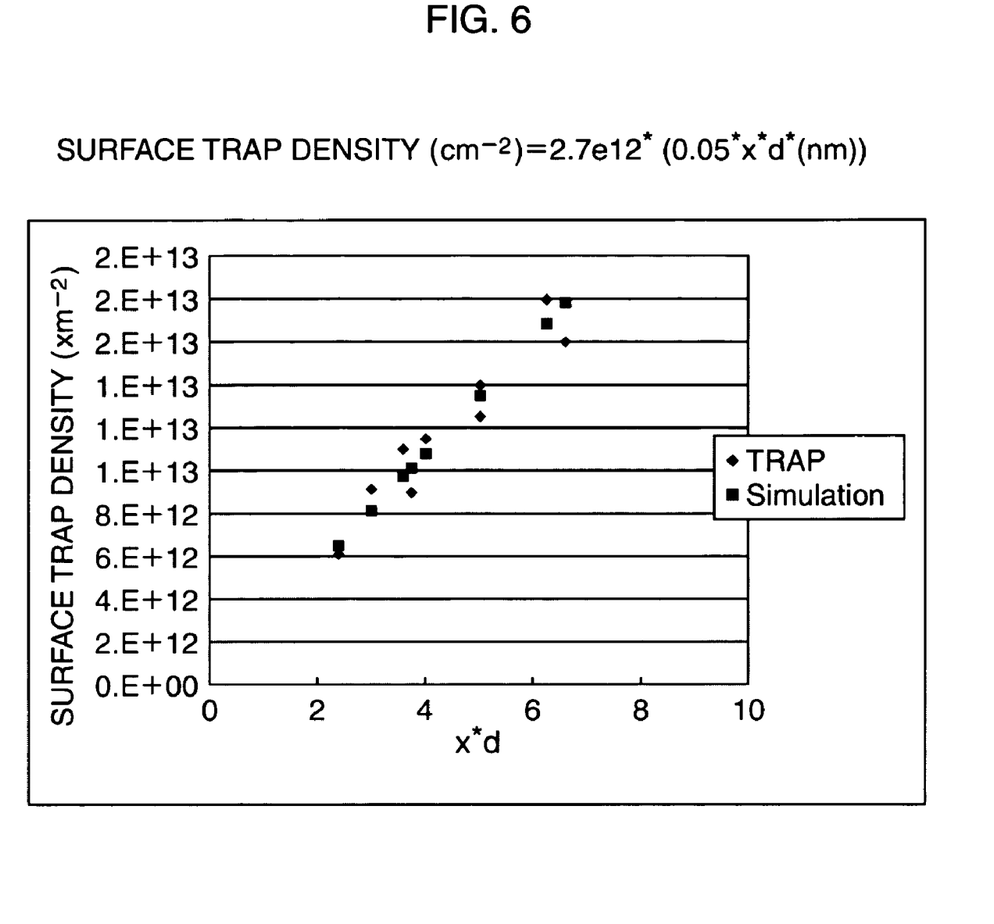
FIG. 6 is a characteristic chart showing relations between x×d and surface trap density.
Figure 7:
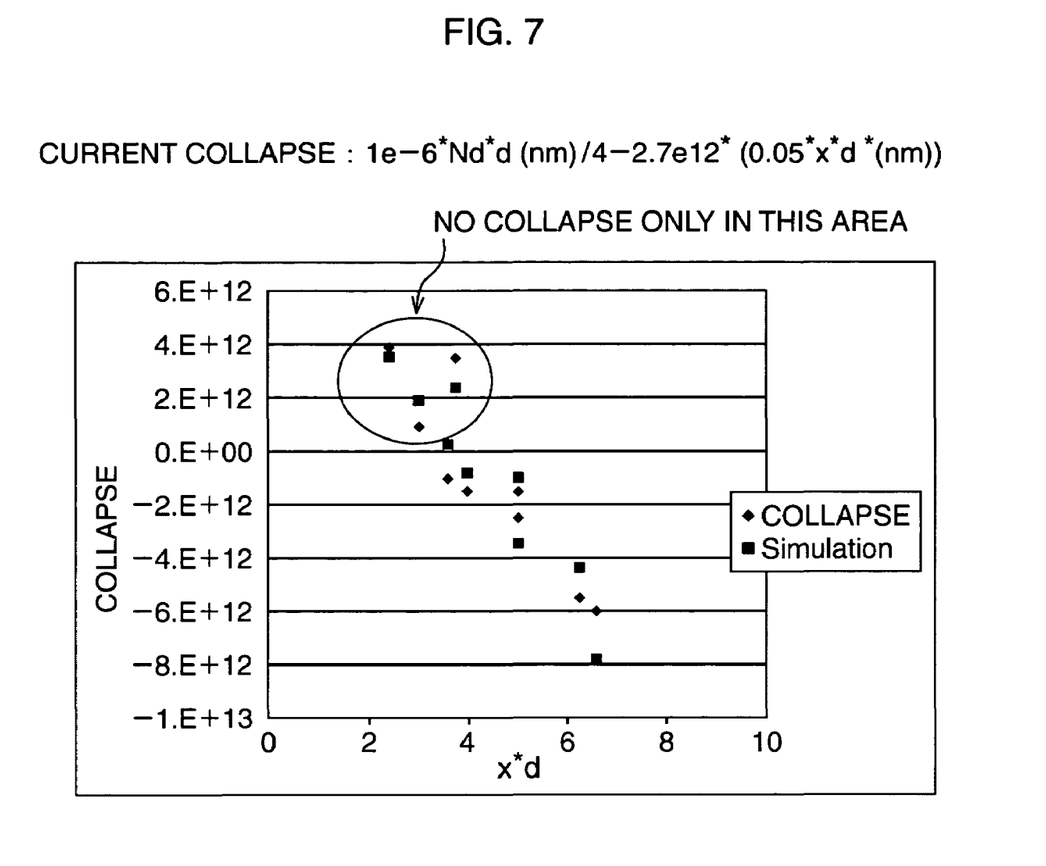
FIG. 7 is a characteristic chart showing relations between x×d and current collapse.

With respect to Piezo−electronic effect+spontaneous polarization, FIG. 5 shows relations between x and two-dimensional electron gas concentration, FIG. 6 shows relations between x×d and surface trap density, and FIG. 7 shows relations between x×d and current collapse.

The lower limit of d can be specified based on these relations. Although degree of the effect varies depending on the two-dimensional electron gas concentration, negative value of the amount of current collapse will degrade the device characteristic.

Based on the theoretical background, specific numerical definition of x and d will be shown below.

Figure 8:
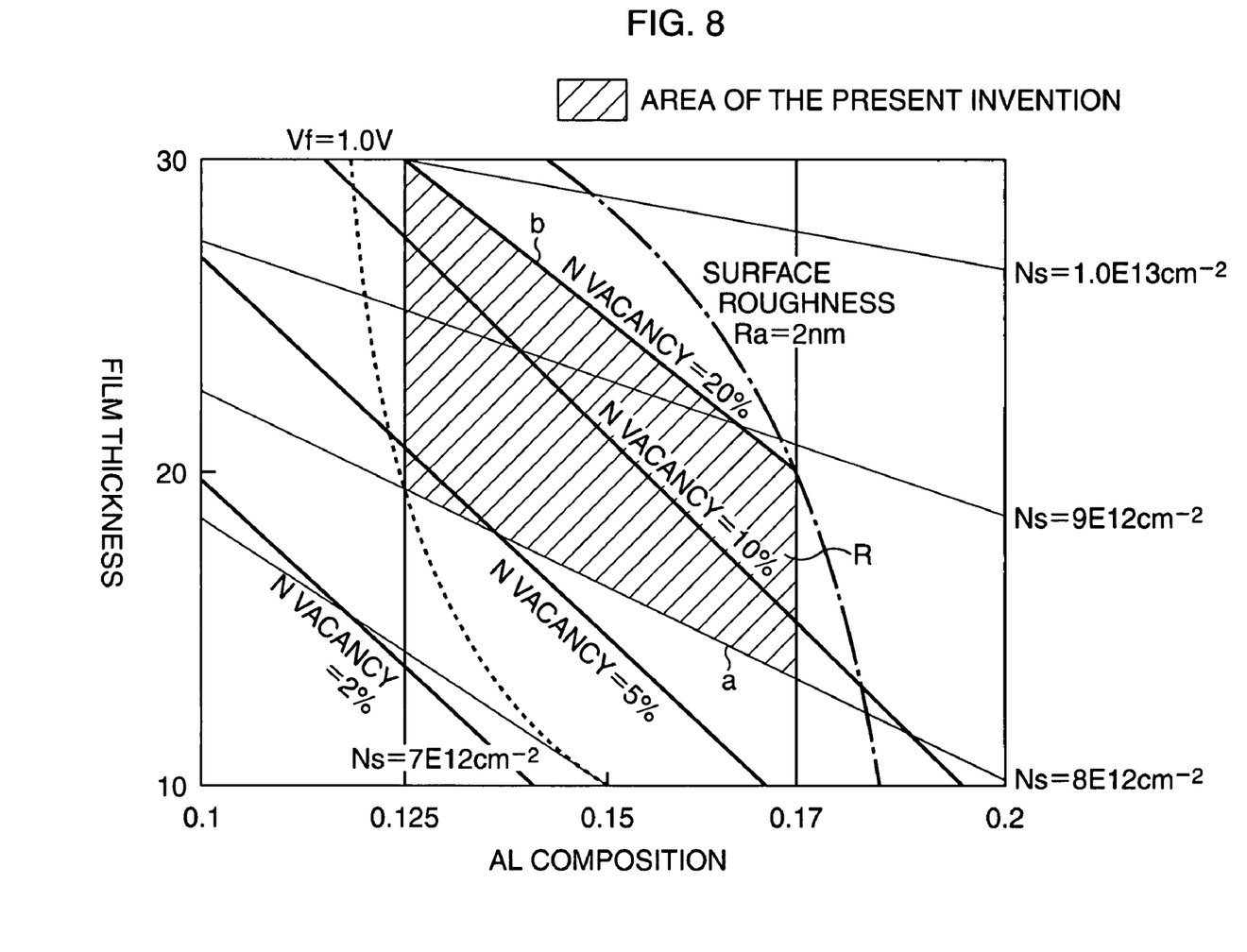
FIG. 8 is a characteristic chart showing relations between Al compositional ratio x and thickness d of an AlGaN layer calculated by simulation.

FIG. 8 shows relations between Al compositional ratio x and thickness d of the second nitride semiconductor layer (AlGaN layer, herein) calculated by simulation.

Line "a" expresses:

$d = -80x + 29$ and line "b" expresses:

$d = -180x + 52$.

The nitrogen vacancy tends to generate when the Al compositional ratio x of the AlGaN layer has a large value as being affected by the strain. Another known problem is that Ga is more likely to cause selective elimination as compared with Al. Nitrogen tends to be eliminated even when GaN is stacked on the AlGaN layer if strain ascribable to the AlGaN layer is large. It was found that the Al compositional ratio x in the surficial structure of the GaN layer suppressed to as low as 17% or below is successful in reducing the strain to thereby prevent nitrogen from being removed. The compositional ratio exceeding 17% is not successful in reducing the surface roughness, where steps as large as 2 nm or above formed on the surface will cause local concentration of the electric field. It is therefore necessary to suppress x lower than 17% (preferably lower than 16%). It was also found that, in the surface structure of the GaN layer, the two-dimensional electron gas concentration becomes too low and also the forward gate voltage resistance (Vf) becomes too low unless the Al compositional ratio x is adjusted to 12.5% or above (preferably 14% or above). The present inventors thus found out that the nitrogen elimination is successfully avoidable by reducing the strain while preventing the two-dimensional electron gas from becoming too scarce.

The strain becomes too large also when the thickness becomes as large as 29.5 nm or above. It was thus found that the thickness is necessarily thinner than 29.5 nm (preferably 24 nm or thinner) from an operational viewpoint. On the other hand, the thickness d of smaller than 15.4 nm will make the layer more susceptible to process damage due to an excessively low two-dimensional electron gas concentration, and may conversely result in nitrogen elimination. It was thus found that the thickness is necessarily 15.4 nm or larger (preferably 17 nm or thicker) from an operational viewpoint.

As judged from the above, the second nitride semiconductor layer preferably falls within area R shown in FIG. 8. That is, a quantitative relation between the Al compositional ratio x and thickness d is given as:

$$-80x+29 < d < -180x+52$$

where $$0.125 \leq x < 0.17(0.18)$$

and $$15.4 \leq d < 29.5.$$

More preferable ranges for x and d are:

$$0.14 \leq x \leq 0.16$$

and $$17 \leq d \leq 24.$$

[3] Other Specific Conditions

Other conditions for surely avoiding the aforementioned nitrogen elimination will be shown below.

Sheet resistance of the stack (first to third nitride semiconductor layers, which are the i-GaN layer, AlGaN layer and n-GaN layer, herein) is adjusted to 500 Ω/sq to 850 Ω/sq, and more preferably 550 Ω/sq to 700 Ω/sq.

Doping concentration Nd (/cm$^3$) of the n-type impurity in the AlGaN layer in conjunction with the Al compositional ratio x is expressed as:

$$1 \times 10^{14} \leq Nd \leq -2 \times 10^{19}x + 5 \times 10^{18}$$

where the upper limit is set to as high as $2 \times 10^{18}$ (/cm$^3$) or around. This is successful in keeping a sufficient two-dimensional electron gas concentration without increasing the gate leakage.

Threshold voltage of the gate electrode is preferably adjusted within a range from −2.5 V to −1.5 V, typically to −2 V or around, and current value under a gate voltage Vg of 0 is adjusted within a range from 150 mA/mm to 300 mA/mm, typically to 200 mA/mm or around. This is successful in suppressing the strain to a degree not causative of increase in the gate leakage and of nitrogen elimination.

It is preferable that the thickness of the n-GaN layer is adjusted to 10 nm or smaller, and a difference value (arcsec) of an AlGaN peak and a GaN peak measured using X ray (Kα line) under (0004) diffraction is adjusted to 300 to 400.

The formation of the stack can be carried out by the MOCVD process, in which the AlGaN layer and n-GaN layer are grown under a temperature condition of 1,000° C. or above, in which the flow rate of NH$_3$ after completion of the growth of the n-GaN layer is increased from that during the growth of the n-GaN layer, and in which H$_2$ is used as a carrier gas during the growth of the n-GaN layer and N$_2$ is used as a carrier gas after the growth. These strategies make it possible to suppress the nitrogen vacancy ratio within a range as deep as 2 nm from the surface of the n-GaN layer to as small as of 20% or less, and to prevent the nitrogen elimination.

It is also allowable to configure the AlGaN layer so as to have at least one portion having the compositional ratio x which exceeds the above-described range but not larger than 0.3.

MODIFIED EXAMPLE

Although the foregoing case exemplified the AlGaN layer as the second nitride semiconductor layer, it is also allowable to use an AlGaInN layer in place of the AlGaN layer (the first and third nitride semiconductor layers are subject to change with the modification).

For the case where the AlGaInN layer is used, an InN compositional ratio of 5% will give:

surface roughness (nm)=11×x×d; and reverse gate leakage (μA/mm) (Vg=−5V)=1.8×10$^{-6}$×10$^{\wedge}$ (11×x×d).

When compared under the same Al compositional ratio, AlGaInN has a surface roughness approximately 5 times larger than that of AlGaN, and consequently has a larger reverse gate leakage, whereas the relation between the Al compositional ratio x and thickness d is almost same as that for the above-described AlGaN layer.

For the case where the AlGaInN layer is used, it is also preferable to define the Al compositional ratio x, thickness d (nm) and an In compositional ratio y as:

$$0 < y \leq 0.05$$

and $$x \leq 0.10$$

and $$10 \leq d \leq 15.$$

The In compositional ratio exceeding 5% makes it necessary to lower the growth temperature to as low as 700° C. or around, and this practically makes the growth difficult. The Al compositional ratio x cannot be increased beyond 0.10 in conjunction with the surface roughness. It is also difficult to increase the thickness d beyond 15 nm for the same reason.

SPECIFIC EMBODIMENT OF THE PRESENT INVENTION

A configuration of a compound semiconductor device having a HEMT structure according to the present embodiment, together with a method of fabricating the device, will be explained.

Figure 9:
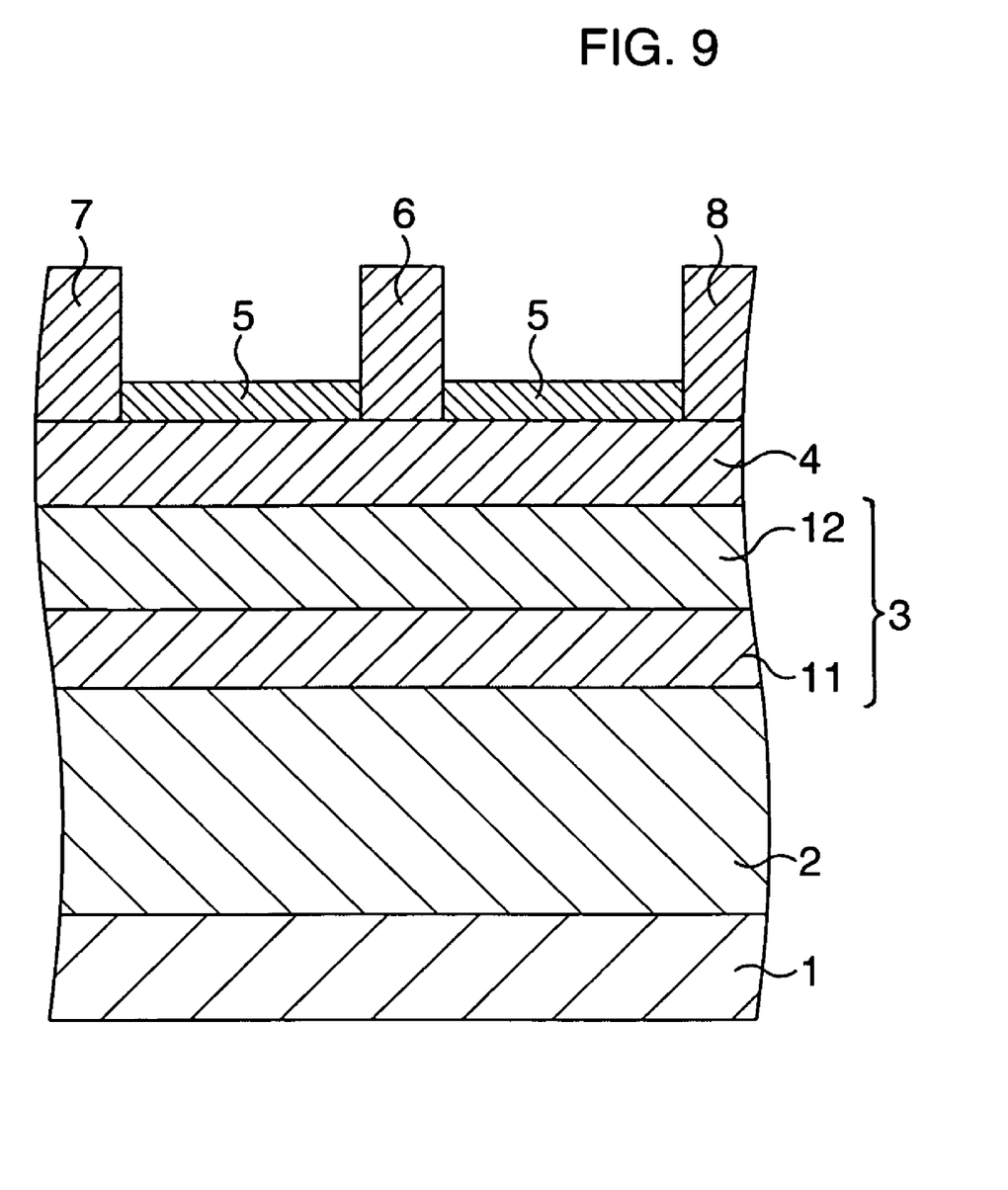
FIG. 9 is a schematic sectional view showing a compound semiconductor device having a HEMT structure according to the present embodiment.

FIG. 9 is a schematic sectional view showing the compound semiconductor device having a HEMT structure according to the present embodiment.

First, a non-doped GaN layer (i-GaN layer) 2, which later becomes an electron transit layer, is formed to a thickness of approximately 1 μm on an SiC substrate 1. Next, an AlGaN layer 3 is grown. More specifically, a non-doped AlGaN layer (i-AlGaN layer) 11 having an Al compositional ratio of approximately 15% is formed to a thickness of approximately 3 nm on the i-GaN layer 2, and further thereon, an AlGaN layer (n-AlGaN layer) 12 doped with Si in a concentration of approximately $2 \times 10^{18}/cm^3$ and having an Al compositional ratio of approximately 15% is formed to a thickness of approximately 17 nm, to thereby form the double-layered AlGaN layer 3 comprising these layers. Next, on the n-AlGaN layer 11, a GaN layer (n-GaN layer) 4 doped with an n-type impurity is formed to a thickness of approximately 5 nm.

Sheet resistance of the stack comprising the layers 2, 3 and 4 is as much as 720 $\Omega$/sq or around. The stack is formed by the MOCVD process under a growth pressure of approximately 100 Torr. During the growth of the n-GaN layer 4, growth temperature is adjusted to 1,100° C. or below, $H_2$ is used as a carrier gas, and flow rate of $NH_3$ is adjusted to approximately 1.2 L/min. The flow rate of $NH_3$ herein is more than hundred thousand times larger than that of a Ga source. After the n-GaN layer 4 is grown, the temperature is lowered to 1,000° C. or below within 30 seconds while keeping the $NH_3$ flow rate unchanged, the carrier gas is thereafter changed to an $N_2$ base gas, and the temperature is lowered while keeping the $NH_3$ flow rate at 4.5 L/min or around.

Next, a source electrode 7 and a drain electrode 8, which establish ohmic contact with the n-GaN layer 4, are formed by patterning a Ti/Al material, ion implantation for element isolation is carried out, and an SiN film 5 containing N in an amount of approximately 50% is formed by deposition by the plasma CVD process. Resist coating, light exposure through a photomask and development of the resist for forming fine gates are then carried out, and the SiN film 5 is then etched selectively in a portion where a gate is formed later. Resist coating, light exposure through a photomask and development of the resist for forming over-gates are then carried out, Ni/Au as a gate metal is deposited, and a gate electrode 6 is then patterned by the lift-off process.

Figure 10:
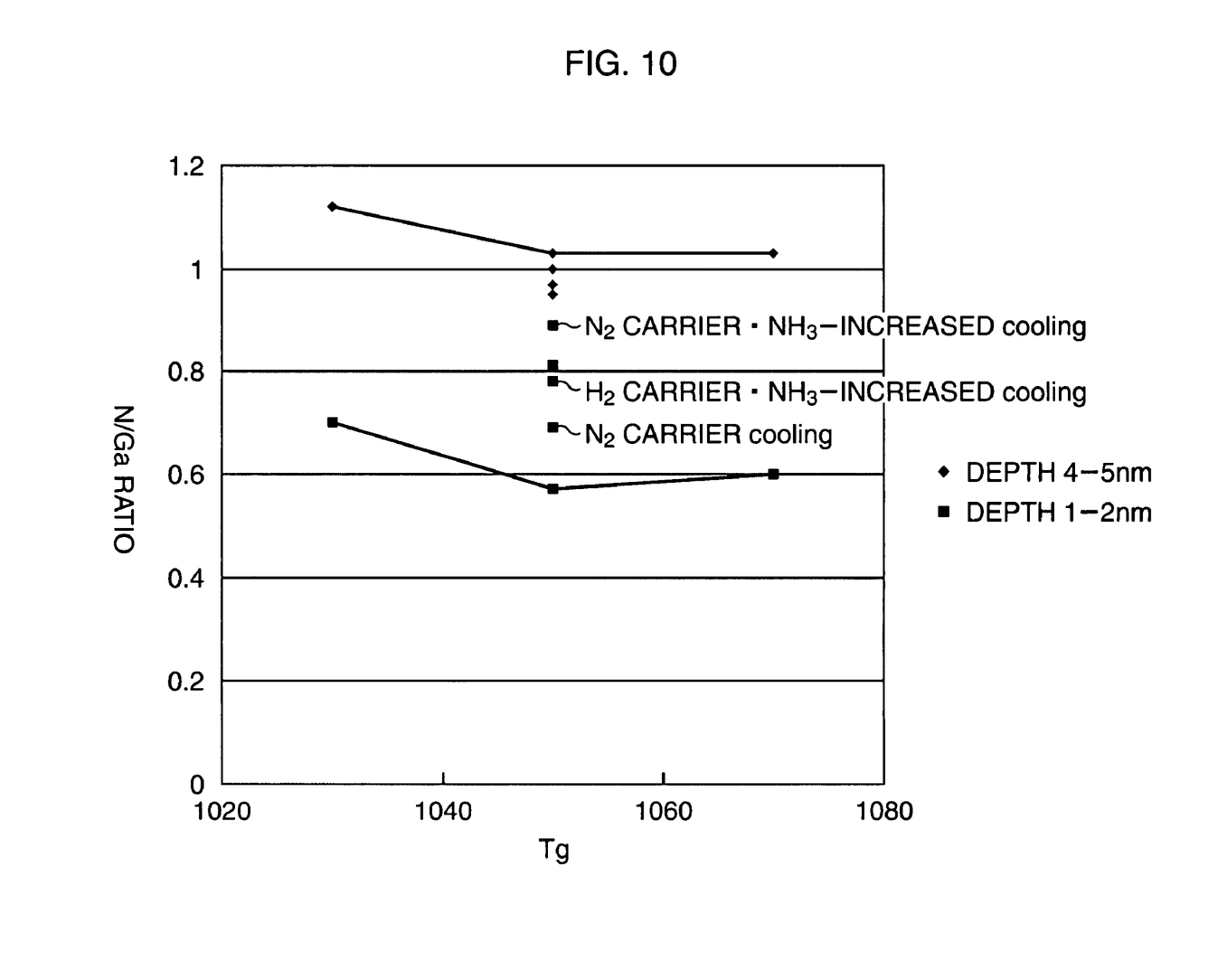
FIG. 10 is a characteristic chart showing results of nitrogen elimination from a GaN layer measured by XPS.

The compound semiconductor device after completion of the formation of the stack was observed by XPS in order to examine nitrogen elimination. It was found from FIG. 10 (Tg denotes the process temperature) that a condition of temperature lowering, rather than growth temperature, is important for controlling nitrogen elimination within a range as deep as 2 nm or less from the surface of the n-GaN layer 4.

Figure 11:
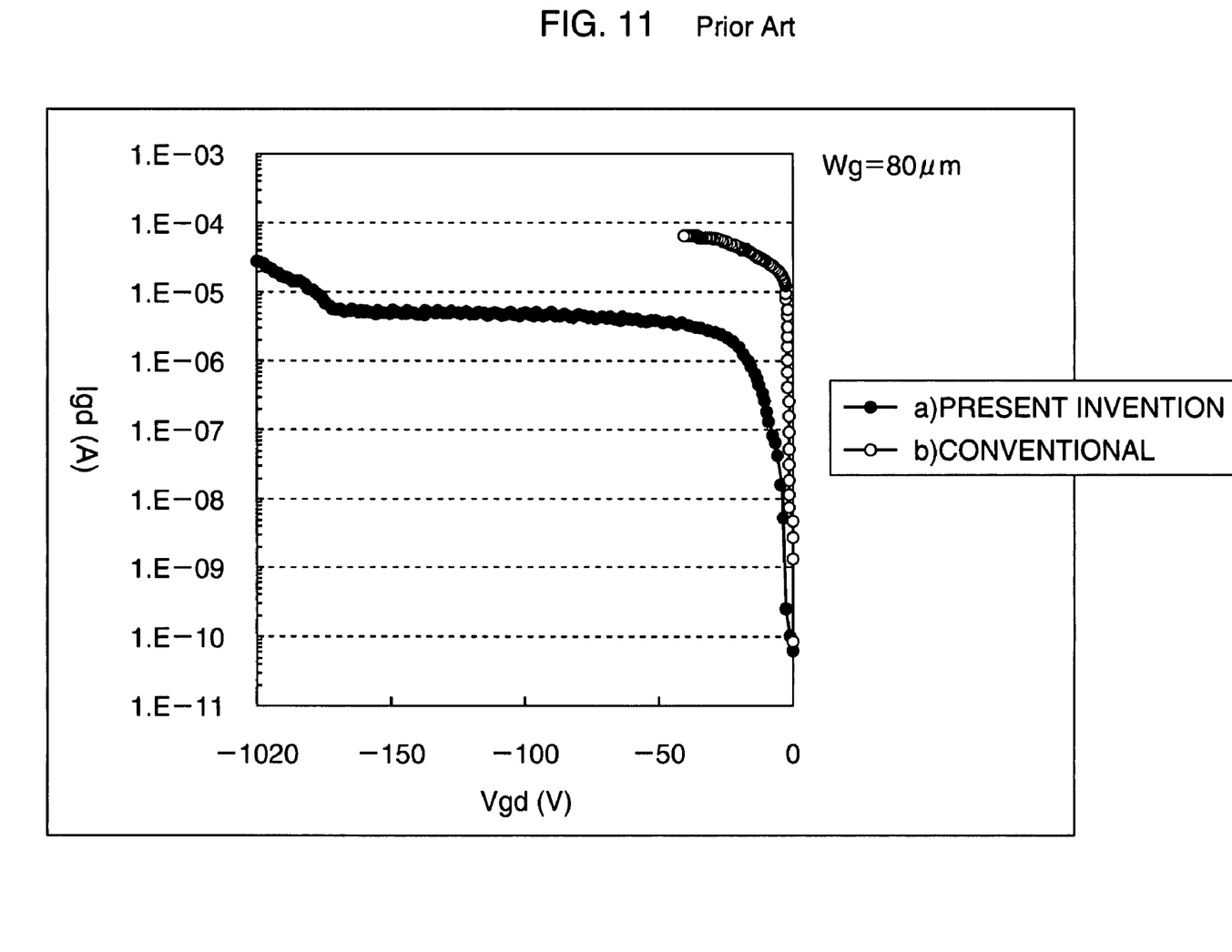
FIG. 11 is a characteristic chart showing measured results of device characteristics in comparison with a conventional compound semiconductor device.

The compound semiconductor device was also examined for the device characteristics (relation between gate-drain voltage and gate-drain current) in comparison with the conventional compound semiconductor device previously shown in FIG. 12. Results of the measurement were shown in FIG. 11. The conventional compound semiconductor device is configured similarly to the present embodiment except that the i-AlGaN layer 111 is formed to a thickness of approximately 3 nm and as having an Al compositional ratio of approximately 25%, and the n-AlGaN layer 112 is formed to a thickness of approximately 22 nm and as having an Al compositional ratio of approximately 25%. It is clear from FIG. 11 that the gate leakage current of the present embodiment is reduced by a factor of as close as 100 as compared with that in the conventional example.

The present invention is successful in improving RF characteristic through reduction in the current collapse, achieving voltage resistance required for the amplifiers at the base stations for cellular phone, actualizing a 50-V operation for example, and consequently making a contribution to opening-up of compound semiconductor market.

What is claimed is:

1. A compound semiconductor device having a stack formed on a substrate,
    said stack comprising a first nitride semiconductor layer which later becomes an electron transit layer;
    a second nitride semiconductor layer which later becomes an electron supply layer and contains Al; and
    a third nitride semiconductor layer having an Al content of zero or smaller than that of said second nitride semiconductor layer, all of the layers being sequentially grown on said substrate, wherein
    said third nitride semiconductor layer has a nitrogen vacancy ratio of 20% or less within a range as deep as 2 nm or less from the surface thereof.

2. The compound semiconductor device according to claim 1, wherein compositional ratio x of Al and thickness d (nm) of said second nitride semiconductor layer satisfy the relations of:

$$0.14 \leq x \leq 0.16;$$

and $$17 \leq d \leq 24;$$

and said stack has a sheet resistance of 550 $\Omega$/sq to 850 $\Omega$/sq.

3. The compound semiconductor device according to claim 2, wherein said second nitride semiconductor layer include therein at least one portion having the compositional ratio x which exceeds the above-described range but not larger than 0.3.

4. The compound semiconductor device according to claim 1, further comprising a gate and source-and-drain regions on said stack,
    said gate having a threshold voltage of –2.5 V to –1.5 V.

5. The compound semiconductor device according to claim 4, showing a current value of 150 mA/mm to 300 mA/mm at a gate voltage Vg of 0.

6. The compound semiconductor device according to claim 1, wherein said second nitride semiconductor layer is doped with an n-type impurity, said impurity having a concentration Nd ($1cm^3$) of $$1 \times 10^{14} \leq Nd \leq -2 \times 10^{19}x + 5 \times 10^{18}.$$

7. The compound semiconductor device according to claim 1, wherein said first and third nitride semiconductor layers contain GaN and said second nitride semiconductor layer contains AlGaN, and
    a difference value (arcsec) of an AlGaN peak and a GaN peak measured using X ray (Ka line) under (0004) diffraction falls within a range from 300 to 400.

8. A compound semiconductor device having a stack formed on a substrate,
    said stack comprising a first nitride semiconductor layer which later becomes an electron transit layer;
    a second nitride semiconductor layer which later forms an electron supply layer and contains Al, and wherein said second nitride semiconductor layer has a compositional ratio x of Al of $0.125 \leq x < 0.18$; and
    a third nitride semiconductor layer having an Al content of zero or smaller than that of said second nitride semiconductor layer, all of the layers being sequentially grown on said substrate, wherein
    said second nitride semiconductor layer is formed in a thickness so as to satisfy the following relation:

$$-80x + 29 < d < -180x + 52$$

where x denotes the compositional ratio of Al and d (nm) denotes the thickness.

9. The compound semiconductor device according to claim 8, wherein said third nitride semiconductor layer has a thickness of 10 nm or less.

10. The compound semiconductor device according to claim 8, wherein compositional ratio x of Al and thickness d (nm) of said second nitride semiconductor layer satisfy the relations of:

$0.14 \leq x \leq 0.16$;

and $17 \leq d \leq 24$;

and said stack has a sheet resistance of 550 Ω/sq to 850 Ω/sq.

11. The compound semiconductor device according to claim 10, wherein said second nitride semiconductor layer includes therein at least one portion having the compositional ratio x which exceeds the above-described range but not larger than 0.3.

* * * * *